(12) United States Patent
Abe et al.

(10) Patent No.: US 9,017,929 B2
(45) Date of Patent: Apr. 28, 2015

(54) FABRICATION METHOD FOR PATTERN-FORMED STRUCTURE

(75) Inventors: Makoto Abe, Tokyo-to (JP); Masaaki Kurihara, Tokyo-to (JP); Kazuaki Baba, Tokyo-to (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 1253 days.

(21) Appl. No.: 11/855,244

(22) Filed: Sep. 14, 2007

(65) Prior Publication Data

US 2008/0068441 A1  Mar. 20, 2008

(30) Foreign Application Priority Data

Sep. 15, 2006 (JP) ................. 2006-250794

(51) Int. Cl.

| | | |
|---|---|---|
| G03F 7/207 | (2006.01) | |
| B29D 11/00 | (2006.01) | |
| B82Y 10/00 | (2011.01) | |
| B82Y 40/00 | (2011.01) | |
| G03F 7/00 | (2006.01) | |
| G03F 7/20 | (2006.01) | |

(52) U.S. Cl.

CPC ........... *B29D 11/00365* (2013.01); *B82Y 10/00* (2013.01); *B82Y 40/00* (2013.01); *G03F 7/0002* (2013.01); *G03F 7/2053* (2013.01); *G03F 7/2059* (2013.01)

(58) Field of Classification Search

CPC .............. H01J 37/3174; H01J 37/3026; H01J 2237/31776; G03G 15/04

See application file for complete search history.

(56) References Cited

U.S. PATENT DOCUMENTS

| | | | | |
|---|---|---|---|---|
| 5,193,008 | A | * 3/1993 | Frazier et al. | ................... 358/1.2 |
| 2002/0080377 | A1 | * 6/2002 | Tonami et al. | ................. 358/1.9 |
| 2006/0061708 | A1 | 3/2006 | Umebayashi et al. | |
| 2008/0056746 | A1 | * 3/2008 | Suhara | ............................ 399/56 |

FOREIGN PATENT DOCUMENTS

| | | |
|---|---|---|
| JP | 60-008844 | 1/1985 |
| JP | 02-098463 A | 4/1990 |
| JP | 07-235075 A | 9/1995 |
| JP | 8-504515 A | 5/1996 |
| JP | 08-174563 | 7/1996 |
| JP | 2004-070087 | 3/2004 |
| TW | 129875 | 3/1990 |
| TW | 200628921 | 8/2006 |
| WO | 94/12911 A1 | 6/1994 |

* cited by examiner

*Primary Examiner* — Daborah Chacko Davis
(74) *Attorney, Agent, or Firm* — Ladas & Parry LLP

(57) ABSTRACT

An object of the present invention is to provide a fabrication method for pattern-formed structure having a smooth three-dimensional structure through a fewer processes. To achieve the object, the present invention provides a fabrication method for pattern-formed structure comprising: a dot modulation pattern forming process of binarizing a shape of a targeted three-dimensional structure to form a dot modulation pattern, a writing process of using the dot modulation pattern to write directly by a writer on a photosensitive resin layer formed on a substrate, and a developing process of developing the photosensitive resin layer after the writing to form a resin layer with three-dimensional structure, wherein the writing process is performed by a writing energy supplying method in which writing energy is supplied to the photosensitive resin layer by an area larger than a minimum dot area in the dot modulation pattern.

8 Claims, 6 Drawing Sheets

FIG. 1A  FIG. 1B  FIG. 1C
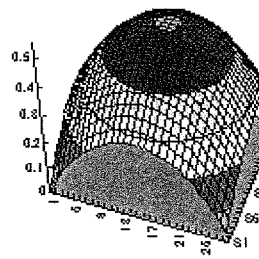
Design
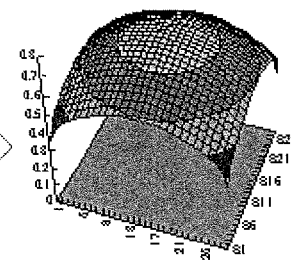
Gray scale data
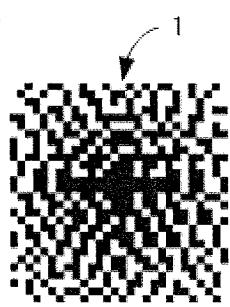
Dot modulation pattern
(Binary data)
FIG. 2A
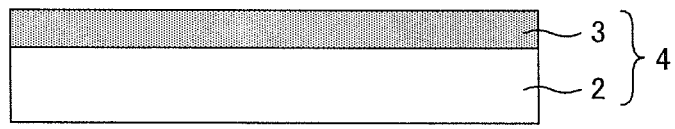
FIG. 2B
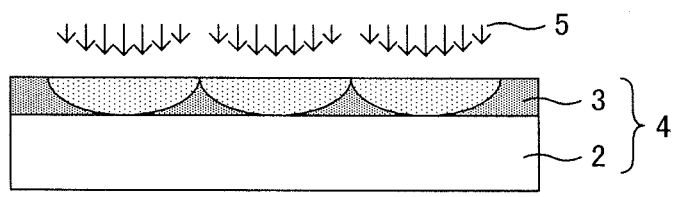
FIG. 2C
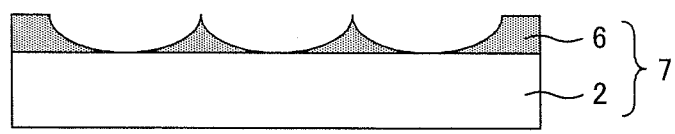

Dot modulation

One pass writing and same beam setting

Dose modulation

One pass writing and multiple beam setting

Same beam setting and multiple pass writing

FABRICATION METHOD FOR PATTERN-FORMED STRUCTURE

BACKGROUND OF THE INVENTION

1. Field of the Invention

The present invention relates to a fabrication method for pattern-formed structure having a smooth three-dimensional structure.

2. Description of the Related Art

Conventionally, it has been desired to develop a blazed grating or microlens having a smooth curved surface. In reality, however, methods of producing a curved surface approximated by multistep etching are generally used. FIGS. 11A to 11H are explanatory views illustrating a conventional technique of producing a blazed grating by exposure to electron beam. As illustrated, first, a resist layer 13 is formed on a member in which a Cr layer 12 is formed on a quartz substrate 11, and the resultant is exposed to electron beam 14 into the form of a line and space pattern having a pitch "p" (FIG. 11A). Next, the resist layer 13 is developed (FIG. 11B), and the Cr layer 12 and the quartz substrate 11 are etched (FIG. 11C). The resist layer 13 is once removed (FIG. 11D). Thereafter, a resist layer 13' is again formed on the etched quart substrate 11, and the resultant is alignment-exposed to electron beam 14' into the form of a line and space pattern having a pitch "2p" (FIG. 11E). In the same manner, development (FIG. 11F) and etching (FIG. 11G) are performed, whereby a 4-step blazed grating can be yielded (FIG. 11H). In order to obtain a structure having steps the number of which is "$2^n$", it is generally necessary to perform exposure, development and etching for "n" times.

When the number of times of exposure, development and etching is increased as described above, the resultant surface can be further approximated to a curved surface. However, lenses or the like that are obtained by approximating their surface to a curved surface by multistep etching are poorer in performances in many cases than lenses having a smooth curved surface. As described above, in order to obtain steps the number of which is "$2^n$", it is necessary to repeat exposure, development and etching for "n" times; therefore, the following problem is caused: in order to increase the number of the steps to make the resultant surface close to a smooth curved surface, costs for the production increase. In addition, as the number of the steps becomes larger, the width of each of the steps becomes smaller; thus, there is also caused a problem that an expensive writer exhibiting a high resolution is required. It is therefore desired to develop a method making it possible to form a smooth curved surface by exposure, development and etching the repeated time number of which is smaller.

Japanese Patent Application Laid-Open (JP-A) No. 60-8844 discloses a photoetching method using electron beam in which at the time of forming a resist pattern having a substantially saw-tooth cross section by the beam irradiation, irregularities generated correspondingly to the intensity distribution of spots of the beam are made smooth. This photoetching method is a method of making three-dimensional writing directly by the electron beam. Moreover, JP-A No. 8-174563 discloses a method of forming a microscopically smooth, three-dimensional surface shape. This method is a method of using a resist in which the contrast is a "γ" value of 2.0 or less.

SUMMARY OF THE INVENTION

In light of the above-mentioned circumstances, the present invention has been made. An object thereof is to provide a fabrication method for pattern-formed structure having a smooth three-dimensional structure through a fewer processes.

To solve the above-mentioned problems, the present invention provides a fabrication method for pattern-formed structure comprising: a dot modulation pattern forming process of binarizing a shape of a targeted three-dimensional structure to form a dot modulation pattern, a writing process of using the dot modulation pattern to write directly by a writer on a photosensitive resin layer formed on a substrate, and a developing process of developing the photosensitive resin layer after the writing to form a resin layer with three-dimensional structure, wherein the writing process is performed by a writing energy supplying method in which writing energy is supplied to the photosensitive resin layer by an area larger than a minimum dot area in the dot modulation pattern.

According to the invention, the writing process is performed by the writing energy supplying method in which writing energy is supplied to the photosensitive resin layer by an area which is larger than a minimum dot area in the dot modulation pattern; therefore, the writing energy can be supplied to the photosensitive resin layer in overlapping manner so that a pattern-formed structure having a smooth three-dimensional structure can be obtained.

In the present invention, the writing energy supplying method is preferably a method of using a laser writer and making a wavelength of laser beam irradiated from the laser writer larger than a dot size of the dot modulation pattern. When the wavelength of the laser beam is larger than the dot size, the writing energy can be supplied to the photosensitive resin layer by the area which is larger than the minimum dot areas.

In the present invention, the writing energy supplying method is a method of using an electron beam writer, rendering electron beam irradiated from the electron beam writer spot beam, and making a beam size of the spot beam larger than a dot size of the dot modulation pattern. When the beam size of the electron spot beam is larger than the dot size, the writing energy can be supplied to the photosensitive resin layer by the area which is larger than the minimum dot areas.

Further, the writing energy supplying method of the present invention is preferably a method of using an electron beam writer, and rendering electron beam irradiated from the electron beam writer variable shaped beam. By use of the variable shaped beam, the writing can be made collectively in wider areas so that the writing energy can be effectively supplied to the photosensitive resin layer.

In the present invention, the pattern-formed structure is preferably a template for imprint. This makes it possible to give a template suitable for the production of a microlens or the like, which is required to have a smooth curved surface structure.

The present invention further provides a fabrication method for pattern-formed substrate, comprising an etching process of using the pattern-formed structure obtained by the above-mentioned fabrication method for pattern-formed structure to etch the substrate of the pattern-formed structure along a shape of the resin layer with three-dimensional structure of the pattern-formed structure.

According to the invention, by etching the substrate along the shape of the resin layer with three-dimensional structure of the pattern-formed structure described above, a pattern-formed substrate having a smooth three-dimensional structure can be obtained.

In the present invention, the pattern-formed substrate is preferably a template for imprint. This makes it possible to give a template suitable for the production of a microlens or the like, which is required to have a smooth curved surface structure.

The present invention can achieve an effect of being able to provide a fabrication method for pattern-formed structure having a smooth three-dimensional structure through a fewer processes.

BRIEF DESCRIPTION OF THE DRAWINGS

FIGS. 1A to 1C are explanatory views showing a method of forming a dot modulation pattern used in the present invention.

FIGS. 2A to 2C are schematic sectional views illustrating an example of the pattern-formed structure fabrication method of the present invention.

DESCRIPTION OF THE PREFERRED EMBODIMENTS

Figure 3:
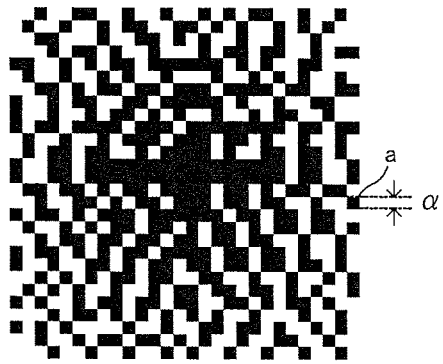
FIG. 3 is a view illustrating a dot modulation pattern used in the present invention.

The pattern-formed structure fabrication method of the invention and the pattern-formed substrate fabrication method thereof will be described in detail hereinafter.

A. Pattern-Formed Structure Fabrication Method

The fabrication method for pattern-formed structure of the present invention will be explained first. The fabrication method for pattern-formed structure of the present invention comprises: a dot modulation pattern forming process of binarizing a shape of a targeted three-dimensional structure to form a dot modulation pattern, a writing process of using the dot modulation pattern to write directly by a writer on a photosensitive resin layer formed on a substrate, and a developing process of developing the photosensitive resin layer after the writing to form a resin layer with three-dimensional structure, wherein the writing process is performed by a writing energy supplying method in which writing energy is supplied to the photosensitive resin layer by an area larger than a minimum dot area in the dot modulation pattern.

According to the invention, the writing process is performed by the writing energy supplying method in which writing energy is supplied to the photosensitive resin layer by an area which is larger than the minimum dot area in the dot modulation pattern; therefore, the writing energy can be supplied to the photosensitive resin layer in overlapping manner so that a pattern-formed structure having a smooth three-dimensional structure can be obtained. Furthermore, according to the invention, the writing is performed to change the exposure dose smoothly, thereby making it possible to form a smooth curved surface structure by a one-time operation of the writing, development and etching. Accordingly, in the invention, costs can be made considerably lower than in the multistep etching. Moreover, the invention has an advantage that it is unnecessary to use a high-resolution writer as described above since the number of times of the exposure is made small.

The following will describe the pattern-formed structure fabrication method of the invention with reference to the drawings. As illustrated in FIGS. 1A to 1C, in the invention, a three-dimensional structure is firstly designed (FIG. 1A). Next, a parameter for which the material of a photosensitive resin to be used and other factors are considered is used to convert the structure to gray scale data (FIG. 1B), and lastly the gray scale data are binarized to form a dot modulator pattern 1. Next, as illustrated in FIGS. 2A to 2C, prepared is a substrate 4 for exposure comprising a substrate 2 and a positive photosensitive resin layer 3 formed on the substrate 2 (FIG. 2A). The following processes are subsequently performed: a writing process of using the dot modulation pattern 1 to irradiate a laser beam 5 to the photosensitive resin layer 3 from a writer (FIG. 2B); and a developing process of developing the photosensitive resin layer after the writing to form a resin layer with three-dimensional structure 6 having a smooth curved surface structure (FIG. 2C). This makes it possible to yield a pattern-formed structure 7 having the substrate 2 and the resin layer with three-dimensional structure 6 formed on the substrate 2. In this invention, the writing process is performed by a specified writing energy supplying method. This method will be described in detail later in item "2. Writing process".

Each of the processes in the pattern-formed structure fabrication method of the invention will be detailed hereinafter.

1. Dot Modulation Pattern Forming Process

First, the dot modulation pattern forming process in the invention is described herein. This process is a process of binarizing the shape of the targeted three-dimensional structure, thereby forming the dot modulation pattern.

In the invention, the "dot modulation pattern" means binarized data in which indications as to whether writing should be carried out (ON) or not (OFF) are represented in the unit of a dot. In the invention, an area which the dot, which is any one of minimum units in the dot modulation pattern, occupies is referred to as a "minimum dot area", and the size thereof is referred to as the "dot size". With reference to FIG. 3, this matter will be specifically described hereinafter. The "dot modulation pattern" is a pattern in which indications as to whether writing should be carried out or not are represented in unit of a black dot (for, e.g., the ON) or a white dot (for, e.g., the OFF)), respectively. "Minimum dot area" means an area at which the black or white dot in a rectangular form, which is a minimum unit in the dot modulation pattern, occupies. The "dot size" means the length "α" of a side of the minimum dot area "a". For example, a matter that the dot size is 50 nm means that indications as to whether writing should be carried out (ON), or not (OFF) are controlled in the unit of a divisional area of 50 nm square. The shape of the minimum dot area may be any shape such as a square, a rectangle and a circle.

The dot size is not particularly limited, and is, for example, from 10 nm to 100 nm, preferably from 15 nm to 800 nm, and even more preferably from 20 nm to 60 nm. The dot size is desirably the size of a writing grid.

The dot modulation pattern used in the invention may be a pattern about which the densities of black dots and white dots which occupy an area are appropriately varied, thereby causing a writer to write so as to give a smooth three-dimensional structure, or a pattern about which the sizes of individual dots are appropriately varied, thereby causing a writer to write so as to give a smooth three-dimensional structure. In the invention, the dot modulation pattern is preferably a pattern in which the densities of individual dots are varied since the dot modulation pattern is easily formed.

The method of binarizing the shape of a targeted three-dimensional structure, thereby forming a dot modulation pattern is not particularly limited as long as the method is a method capable of giving a predetermined dot modulation pattern. A specific example of the method is a method described in JP-A No. 2004-70087.

2. Writing Process

Next, the writing process in the invention is described herein. This process is a process of using the dot modulation pattern to write directly on a photosensitive resin layer formed on a substrate by means of a writer.

Figure 4A:
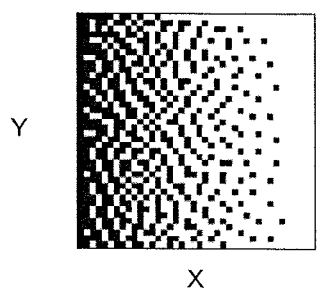
FIGS. 4A to 4D are explanatory views, referring to which a difference between dot modulation and dose modulation is described.
Figure 4B:
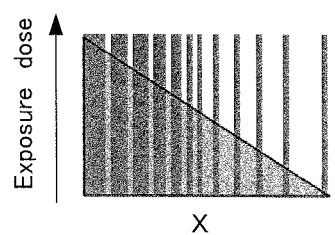
Figure 4C:
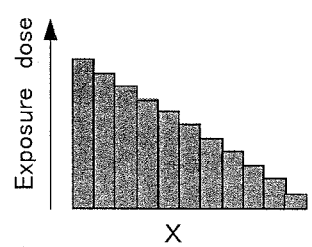
Figure 4D:
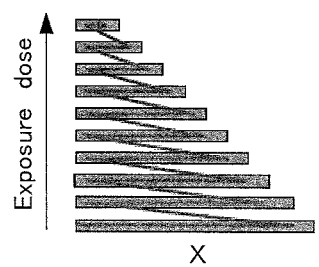
Figure 4D:
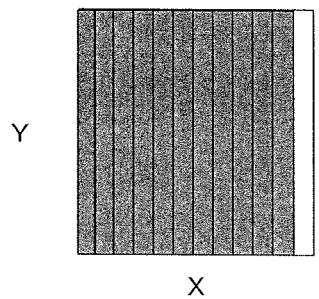

According to the invention, the dot modulation pattern is used to make direct writing; therefore, writing energy for giving a smooth three-dimensional structure can be supplied to the photosensitive resin layer by a one-time operation of the writing without varying the beam intensity of the beam, i.e., by the same beam intensity. When a dot modulation pattern as shown in e.g., FIG. 4A is used, an exposure dose distribution as shown in FIG. 4B is obtained by performing writing one time without varying the intensity of the beam. On the other hand, in conventional methods based on dose modulation, for obtaining an exposure dose distribution equal to the exposure dose distribution shown in FIG. 4B, it is necessary to vary the beam intensity successively as shown in FIG. 4C or to irradiate a beam having an unchanged beam intensity by plural times as shown in FIG. 4D. In other words, according to the invention, writing energy for giving a smooth three-dimensional structure can be supplied to the photosensitive resin layer in a simpler method than according to conventional methods based on dose modulation.

Figure 5A:
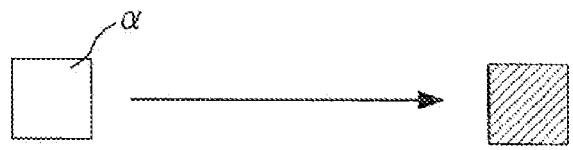
FIGS. 5A and 5B are explanatory views, referring to which a difference between a conventional writing method and the writing method in the present invention is described.
Figure 5B:
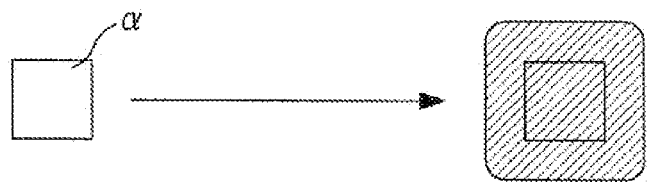

The invention is characterized in that the writing process is performed by a writing energy supplying method in which writing energy is supplied to the photosensitive resin layer by the area larger than the minimum dot area in the dot modulation pattern. In the case of using a dot modulation pattern to write in the prior art, writing energy is supplied to the photosensitive resin layer so as to make the energy-given area equal to the minimum dot area "α" in the dot modulation pattern, as illustrated in FIG. 5A. On the other hand, in the invention, writing energy is supplied to the photosensitive resin layer so as to make the energy-given area larger than the minimum dot areas "α" in the dot modulation pattern, as illustrated in FIG. 5B. This makes it possible that the writing energies in the minimum dot areas adjacent to each other are added to each other in overlapping manner. As a result, the exposure dose can be smoothly changed. The method of positively overlapping the writing energies in this way is entirely different from any writing method in the prior art.

In the invention, the writing energy is supplied to the photosensitive resin layer by the area larger than the minimum dot area. Specifically, when the area of the minimum dot area is set to 1, the writing energy is supplied in such a method that the area where the writing energy is supplied in the photosensitive resin layer is preferably from 1.01 to 100, more preferably from 2 to 20, and even more preferably from 5 to 10.

The writing energy supplying method of the invention is not particularly limited as long as the method is a method in which the writing energy is supplied to the photosensitive resin layer by the area larger than the minimum dot area in the dot modulation pattern. In the invention, the following are appropriately selected: the beam size of the beam irradiated from the writer, the forward scattering and backward scattering of the beam (in the case of a laser, reflection thereof), reflection from the device (fogging), resist contrast (or developing conditions and others), and any combination thereof. The selection makes it possible to supply the writing energy to the photosensitive resin layer by the area larger than the minimum dot area in the dot modulation pattern.

The following will give, as specific examples of the writing energy supplying method in the invention, a method of using a laser writer, a method of using an electron beam writer, and a method of selecting the kind of the photosensitive resin layer or some other factor appropriately, and will describe these methods in detail.

First, the case that the writing energy supplying method in the invention is a method of using a laser writer is described herein. As described above, in this case also, a desired writing energy can be supplied to the photosensitive resin layer by adjusting the scattering and reflection of the beam, resist contrast or the like.

In the invention, it is preferred that the writing energy supplying method is a method of using a laser writer and making the wavelength of a laser beam irradiated from the laser writer larger than the dot size of the dot modulation pattern. It is because when the wavelength of the laser beam is larger than the dot size, the writing energy can be supplied to the photosensitive resin layer by the area which is larger than the minimum dot area.

As described above, the wavelength of the laser beam is preferably larger than the dot size of the dot modulation pattern. Specifically, the wavelength of the laser beam is preferably from 101% to 10000% of the dot size of the dot modulation pattern, more preferably from 200% to 2000% thereof, and even more preferably from 500% to 1000% thereof.

The wavelength of the laser beam is not particularly limited as long as the wavelength is larger than the dot size of the dot modulation pattern. For example, the wavelength is preferably from 150 nm to 1500 nm, more preferably from 200 nm to 1000 nm, and even more preferably from 300 nm to 500 nm.

Specific examples of the kind of the laser beam include Ar laser (363.8 nm), KrF excimer laser (248 nm), and ArF excimer laser (193 nm). Particularly preferred is Ar laser (363.8 nm) In the case of using the laser beam, the dot size of the dot modulation pattern is not particularly limited. For example, the size is preferably from 10 nm to 1000 nm, more preferably from 15 nm to 800 nm, and even more preferably from 20 nm to 600 nm.

Secondly, the case that the writing energy supplying method in the invention is a method of using an electron beam writer is described herein. As described above, in this case also, a desired writing energy can be supplied to the photosensitive resin layer by adjusting the scattering and reflection of the beam, resist contrast, or the like.

In the invention, it is preferred that the writing energy supplying method is a method of using an electron beam writer, rendering an electron beam irradiated from the electron beam writer a spot beam, and making the beam size of the spot beam larger than the dot size of the dot modulation pattern. It is because when the beam size of the electron spot beam is larger than the dot size, the writing energy can be supplied to the photosensitive resin layer by the area larger than the minimum dot area. The "beam size" of the spot beam means the size of the beam irradiated from the writer on the face on which the beam is irradiated. When the cross section of the spot beam has, for example, a circular shape, the size is the diameter thereof.

As described above, the beam size of the electron spot beam is preferably larger than the dot size of the dot modulation pattern. Specifically, the beam size of the electron spot beam is preferably from 101% to 10000% of the dot size of the dot modulation pattern, more preferably from 200% to 2000% thereof, and even more preferably from 500% to 1000% thereof.

The beam size of the electron spot beam is not particularly limited as long as the size is larger than the dot size of the dot modulation pattern. For example, the size is preferably from 10 nm to 2000 nm, more preferably from 15 nm to 1500 nm, and even more preferably from 20 nm to 1000 nm.

In the case of using the electron spot beam, the dot size of the dot modulation pattern is not particularly limited. For example, the size is preferably from 10 nm to 1000 nm, more preferably from 15 nm to 800 nm, and even more preferably from 20 nm to 600 nm.

In the invention, the used electron beam may be a variable shaped beam. That is, the writing energy supplying method may be a method of using an electron beam writer and rendering the electron beam irradiated from the electron beam writer a variable shaped beam. In this case, the beam size of the variable shaped beam usually becomes equal to the dot size of the dot modulation pattern. As described above, however, a desired writing energy can be supplied to the photosensitive resin layer by adjusting the scattering and reflection of the beam, resist contrast or the like. Moreover, for example, the irradiation of the variable shaped beam under defocus conditions makes it possible to supply the writing energy to the photosensitive resin layer by the area larger than the minimum dot area in the dot modulation pattern.

In the case where the writing energy supplying method in the invention is a method of selecting the kind of the photosensitive resin layer or some other factor appropriately, even when for example, a photosensitive resin layer poor in sensitivity to the writing energy is used, the writing energy can be supplied to the photosensitive resin layer by the area larger than an area onto which the writing energy is actually supplied. Moreover, by use of reflection of the energy on the interface between the substrate and the photosensitive resin layer, reflection of the energy on the substrate surface on the side reverse to the interface or the like, the writing energy can be supplied to the photosensitive resin layer by the area larger than the minimum dot area in the dot modulation pattern. In this case, without considering the wavelength of the laser beam, the beam size of the electron beam or other factors, the predetermined writing energy can be supplied to the photosensitive resin layer.

In the invention, direct writing is made onto photosensitive resin layer formed on the substrate.

The substrate used in the invention is different in accordance with the usage of the pattern-formed structure or the like. Examples of the material of the substrate include glasses such as quartz and sodium lime glass; semiconductors such as silicon (Si), gallium nitride (GaN), and gallium arsenide (GaAs); metals such as nickel (Ni) and aluminum (Al); ceramics such as silicon nitride (SiN), silicon oxide ($SiO_2$), and silicon carbide (SiC); and diamond, diamond-like carbon (DLC), and cubic boron nitride (CBN). Quartz and silicon (Si) are preferred, and quartz is particularly preferred.

The thickness of the substrate is not particularly limited, and is usually from 50 μm to 500 μm.

The photosensitive resin layer used in the invention is a layer containing a photosensitive resin. The photosensitive resin may be a positive photosensitive resin or a negative photosensitive resin as long as the resin is a resin optically sensitive to a laser beam, an electron beam or the like. Examples of the positive photosensitive resin include phenol epoxy resin, acrylic resin, polyimide, and cycloolefin. Specific examples thereof include IP 3500 (trade name) manufactured by Tokyo Ohka Kogyo Co., Ltd., PFI27 (trade name) manufactured by Sumitomo Chemical Co., Ltd., and ZEP7000 (trade name) manufactured by Zeon Corporation. An example of the negative photosensitive resin is acrylic resin or the like. Specific examples thereof include polyglycidyl methacrylate (PGMA), and SAL601 (trade name) manufactured by Rohm and Haas Electronic Materials, which is of a chemically amplified type.

The thickness of the photosensitive resin layer is not particularly limited, and is usually from about 10 nm to about 10 μm.

In the invention, a dot modulation pattern is used to direct write by a writer onto a photosensitive resin layer formed on a substrate; in the same method as in the invention, a pattern-formed structure can be obtained by the following process, which is not a process of making direct writing as in the invention: for example, a process of preparing a photomask having a pattern similar to the dot modulation pattern, and using the photomask to expose the photosensitive resin layer to projected light. Furthermore, when an etching process or the like that will be described later is performed, a pattern-formed substrate such as a template can be formed.

3. Developing Process

Next, the developing process in the invention is described herein. This process is a process of developing the photosensitive resin layer after the writing, thereby forming a resin layer with three-dimensional structure. By performing the developing process, a resin layer with three-dimensional structure, which has a smooth three-dimensional structure, is formed.

When the used photosensitive resin is a positive photosensitive resin, a larger amount of the resin is removed in an area to which a larger exposure dose is given out of the entire exposed areas. On the other hand, when the used photosensitive resin is a negative photosensitive resin, a larger amount of the resin is removed in an area to which a smaller exposure dose is given out of the entire exposed areas. An appropriate selection of the kind of the photosensitive resin or conditions for the development make it possible to develop a wider area than the area where the writing energy is supplied in the writing process, for example, so as to form a smoother resin layer with three-dimensional structure.

The method of developing the photosensitive resin layer after the writing process is not particularly limited, and may be, for example, a method of using a developing solution. The developing solution may be an ordinary developing solution, and can be appropriately selected in accordance with the kind of the photosensitive resin, or others. Specific examples of the developing solution include: alkali developing solutions, such as a tetramethyl ammonium solution, a potassium hydroxide solution, a sodium hydroxide solution, and a sodium carbonate solution, each of which is a solution in water; and acidic developing solutions, such as a hydrochloric acid solution, an acetic acid solution, a sulfuric acid solution, and a phosphoric acid solution, each of which is a solution in water.

4. Pattern-Formed Structure

Figure 6A:
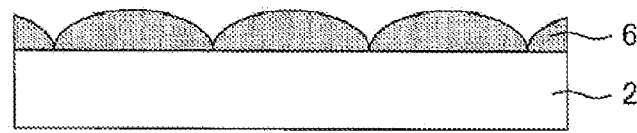
FIGS. 6A to 6C are each a schematic sectional view illustrating an example of a pattern-formed structure obtained by the present invention.
Figure 6B:
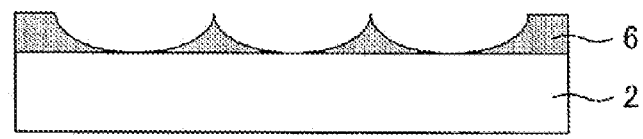
Figure 6C:
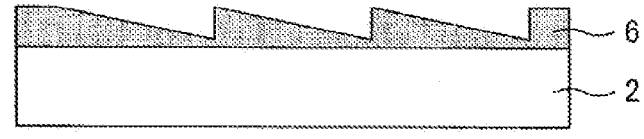

The pattern-formed structure obtained by the invention has a substrate, and a resin layer with three-dimensional structure formed on the substrate. The resin layer with three-dimensional structure formed on the substrate is not particularly limited as long as the layer has a smooth three-dimensional structure. Specific examples thereof include a resin layer with three-dimensional structure 6 in a structural form of convexes (FIG. 6A), a resin layer with three-dimensional structure 6 in a structural form of concaves (FIG. 6B), and a resin layer with three-dimensional structure 6 in a structural form of a blazed grating (FIG. 6C). In particular, when the resin layer with three-dimensional structure of the pattern-formed structure obtained by the invention has a structure in the form of convexes as illustrated in FIG. 6A, the resin layer with three-dimensional structure may be used as microlenses, thereby making it possible to yield a microlens-attached substrate which can be used in various optical members.

The pattern-formed structure obtained by the invention can be used as, for example, a microlens-attached substrate as described above, a template for imprint, an optical element, or the like. In the invention, the pattern-formed structure is in particular preferably a template for imprint, or a microlens-attached substrate, and is more preferably a template for imprint.

B. Pattern-Formed Substrate Fabrication Method

Next, the method of the invention for fabrication a pattern-formed substrate is described herein. The method of the invention is a method comprising an etching process of using the pattern-formed structure obtained by the above-mentioned pattern-formed structure fabrication method to etch the substrate of the pattern-formed structure along the shape of the resin layer with three-dimensional structure of the pattern-formed structure.

According to the invention, etching is performed along the shape of the resin layer with three-dimensional structure of the pattern-formed structure. As a result, a pattern-formed substrate having a smooth three-dimensional structure can be obtained.

Figure 7A:
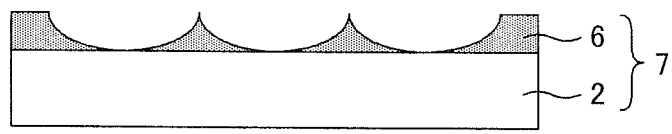
FIGS. 7A and 7B are each a schematic sectional view illustrating an example of the pattern-formed substrate fabrication method of the present invention.
Figure 7B:
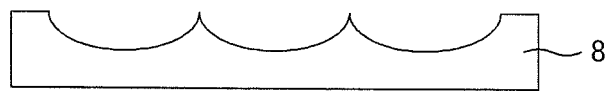

Next, the pattern-formed substrate fabrication method of the invention is described herein with reference to the drawings. FIGS. 7A and 7B are schematic sectional views illustrating an example of the pattern-formed substrate fabrication method of the invention. The pattern-formed substrate fabrication method illustrated in FIGS. 7A and 7B has an etching process of using a pattern-formed structure 7 obtained by the above-mentioned pattern-formed structure fabrication method (FIG. 7A) to etch a substrate 2 along the shape of a resin layer with three-dimensional structure 6 of the pattern-formed structure 7 (FIG. 7B). This makes it possible to yield a pattern-formed substrate 8 having a smooth three-dimensional structure.

The pattern-formed structure used in the invention, the fabrication process thereof, and others are the same as descried in the item "A. Pattern-formed structure fabrication method". Thus, description thereof is not repeated herein.

In the invention, there is performed a process of etching the substrate of the pattern-formed structure along the shape of the resin layer with three-dimensional structure of the pattern-formed structure. The method of etching the substrate is not particularly limited as long as the method is a method capable of transferring the shape of the resin layer with three-dimensional structure to the substrate. The method may be specifically dry etching or the like. Etching gas used in the dry etching may be, for example, $CF_4$, $CHF_3$, $Cl_2$ or $SF_6$.

Figure 8A:
FIGS. 8A to 8C are each a schematic sectional view illustrating a pattern-formed substrate obtained by the present invention.
Figure 8B:
Figure 8C:

The pattern-formed substrate obtained by the invention can be used as, for example, a template for imprint or the like, an optical element such as a microlens array, a blazed grating, or a hologram. In the invention, the pattern-formed substrate is in particular preferably a template for imprint. Specific examples of the pattern-formed substrate obtained by the invention are illustrated in FIGS. 8A to 8C. FIGS. 8A to 8C illustrate a microlens array, a template, and a blazed grating, respectively.

The invention is not limited to the above-mentioned embodiments. The embodiments are examples and any embodiment which has substantially the same as the technical conception recited in the claims of the invention and produces the same effects and advantageous is included in the technical scope of the invention.

EXAMPLES

The invention will be more specifically described by way of the following Examples.

Example 1

A photosensitive resin layer (trade name: ZEP7000, manufactured by Zeon Corporation) was coated onto a 6-inch quartz substrate to give a film thickness of 300 nm, and then direct writing was made thereon in accordance with a pattern as illustrated in FIG. 3. The pattern was made by use of an error variance method disclosed in JP-A No. 2004-70087. Next, a developing solution for the ZEP7000 was used to develop the photosensitive resin layer to yield a pattern-formed structure having a resin layer with three-dimensional structure of an array shape in the form of concaves with a pitch of 2.2 μm and a height of 280 nm.

Figure 9:
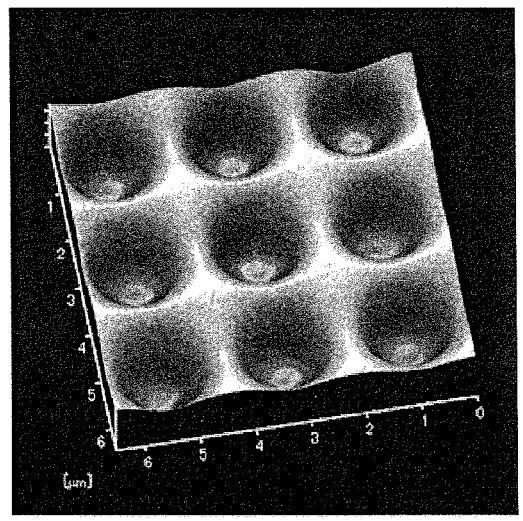
FIG. 9 is an AFM image of a microlens array template obtained in Example 1.

Subsequently, a reactive ion etching device was used to dry-etch the pattern-formed structure, which had the resin layer with three-dimensional structure in the concave form, with $CF_4$ gas, and then the form of the concaves was transferred onto the quartz substrate to yield a microlens array template (pattern-formed structure) having a lens pitch of 2.2 μm and a lens height of 200 nm. An atomic force microscope image of the resultant microlens array template is shown in FIG. 9. As a result, it was verified that the obtained template was a template having a smooth surface.

Example 2

A photosensitive resin layer (trade name: ZEP7000, manufactured by Zeon Corporation) was coated onto a 6-inch quartz substrate to give a film thickness of 300 nm, and then direct writing was made thereon in accordance with a pattern as illustrated in FIG. 4A. The pattern was made by use of an error variance method described in JP-A No. 2004-70087. Next, a developing solution for the ZEP7000 was used to develop the photosensitive resin layer to yield a pattern-formed structure having a resin layer with three-dimensional structure of a blazed grating shape with a pitch of 2.0 μm and a height of 280 nm.

Figure 10:
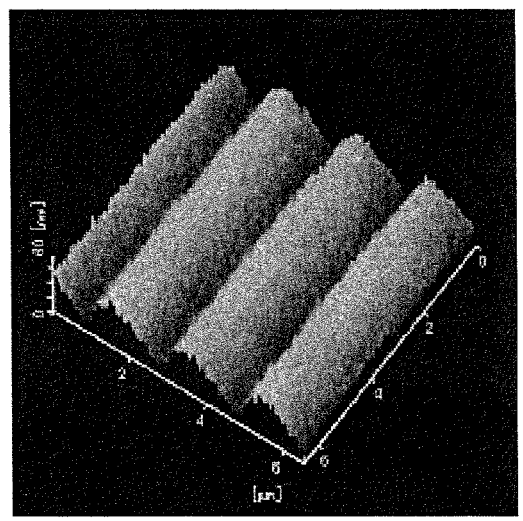
FIG. 10 is an AFM image of a blazed grating template obtained in Example 2.
Figure 11A:
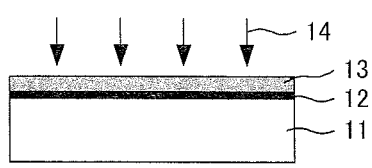
FIGS. 11A to 11H are explanatory views showing the multistep etching.
Figure 11E:
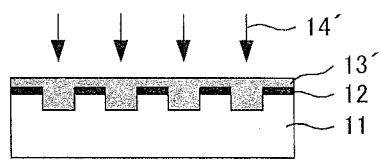
Figure 11B:
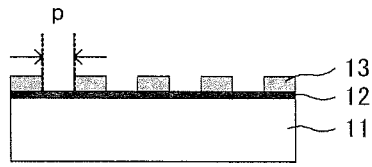
Figure 11F:
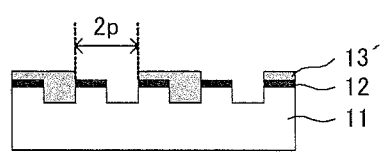
Figure 11C:
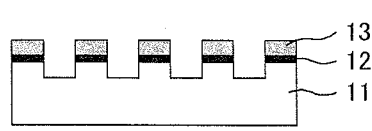
Figure 11G:
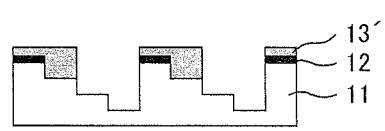
Figure 11D:
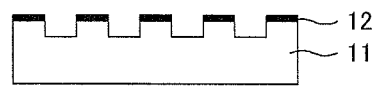
Figure 11H:
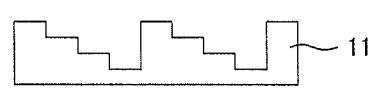

Subsequently, a reactive ion etching device was used to dry-etch the pattern-formed structure, which had the resin layer with three-dimensional structure, with $CF_4$ gas, and then the blazed grating shape was transferred onto the quartz substrate to yield a blazed grating-template having a pitch of 2.0 μm and a height of 200 nm. An atomic force microscope image of the obtained blazed grating-template is shown in FIG. 10. As a result, it was verified that the obtained template was a template having a smooth surface.

What is claimed is:

1. A fabrication method for pattern-formed structure comprising:
   a dot modulation pattern forming process of binarizing a shape of a targeted three-dimensional structure to form a dot modulation pattern,
   a writing process of using the dot modulation pattern to write directly by a writer on a photosensitive resin layer formed on a substrate, and
   a developing process of developing the photosensitive resin layer after the writing to form a pattern-formed structure which is the photosensitive resin layer after the developing and has the shape of the targeted three-dimensional structure,
   wherein the dot modulation pattern is expressed by binarized data in which indications as to whether writing should be carried out (ON) or not (OFF) are represented by per dot, a smallest unit of the dot modulation pattern,
   wherein the writing process is performed by a writing energy supplying method in which writing energy is supplied to a writing energy supplying area of the photosensitive resin layer including both a minimum do area, an area each dot occupies, and an area adjacent to the minimum dot area and the writing energy is supplied per the writing energy supplying area, and
   wherein the ratio of the area of the writing energy supplying area to the area of the minimum dot area is in a range of 5 to 10.

2. The fabrication method for pattern-formed structure according to claim 1, wherein the writing energy supplying method is a method of using a laser writer and making a wavelength of laser beam irradiated from the laser writer larger than a dot size of the dot modulation pattern.

3. The fabrication method for pattern-formed structure according to claim 2, wherein the pattern-formed structure is a template for imprint.

4. The fabrication method for pattern-formed structure according to claim 1, wherein the writing energy supplying method is a method of using an electron beam writer, rendering electron beam irradiated from the electron beam writer spot beam, and making a beam size of the spot beam larger than a dot size of the dot modulation pattern.

5. The fabrication method for pattern-formed structure according to claim 4, wherein the pattern-formed structure is a template for imprint.

6. The fabrication method for pattern-formed structure according to claim 1, wherein the writing energy supplying method is a method of using an electron beam writer, and rendering electron beam irradiated from the electron beam writer variable shaped beam.

7. The fabrication method for pattern-formed structure according to claim 6, wherein the pattern-formed structure is a template for imprint.

8. The fabrication method for pattern-formed structure according to claim 1, wherein the pattern-formed structure is a template for imprint.

* * * * *